US009881534B2

(12) United States Patent
Liu et al.

(10) Patent No.: US 9,881,534 B2
(45) Date of Patent: Jan. 30, 2018

(54) LIGHTING FIXTURE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Jie Liu, Beijing (CN); Junxin Yue, Beijing (CN); Yi Qu, Beijing (CN); Jun Wang, Beijing (CN); Jiamian Sun, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 39 days.

(21) Appl. No.: 15/088,504

(22) Filed: Apr. 1, 2016

(65) Prior Publication Data
US 2016/0305979 A1    Oct. 20, 2016

(30) Foreign Application Priority Data
Apr. 15, 2015    (CN) .......................... 2015 1 0178187

(51) Int. Cl.
*G01R 31/00*    (2006.01)
*G09G 3/00*    (2006.01)
(Continued)

(52) U.S. Cl.
CPC .............. *G09G 3/006* (2013.01); *G02F 1/00* (2013.01); *G09G 1/00* (2013.01); *H01L 2221/00* (2013.01)

(58) Field of Classification Search
CPC ........ G09G 1/00; G09G 2230/00; G02F 1/00; G02F 2201/00; H01L 21/00; H01L 2221/00
See application file for complete search history.

(56) References Cited

U.S. PATENT DOCUMENTS 5,760,829 A  *  6/1998  Sussmeier ............ H04N 17/002
                                                        348/126
5,796,299 A      8/1998  Sei et al.
(Continued)

FOREIGN PATENT DOCUMENTS

CN    101140726 A    3/2008
CN    201387471 Y    1/2010
(Continued)

OTHER PUBLICATIONS

First Office Action dated Mar. 2, 2017 in corresponding Chinese Application No. 201510178187.9.

*Primary Examiner* — Jermele M Hollington
*Assistant Examiner* — Temilade Rhodes-Vivour
(74) *Attorney, Agent, or Firm* — Nath, Goldberg & Meyer; Joshua B. Goldberg

(57) ABSTRACT

Provided is a lighting fixture, which belongs to the technical field of display equipment detection and can be used for solving the problem that an existing lighting fixture is liable to damage a detection probe in a detection process. The lighting fixture includes a work load platform, a lifting unit and a lighting test unit, wherein the work load platform is used for loading a display panel to be subjected to lighting test; the lifting unit is connected with the lighting test unit and used for driving the lighting test unit to ascend and descend; and the lighting test unit is provided with a plurality of probes and is driven by the lifting unit to contact the probes with a circuit test point on the display panel, in order to carry out the lighting test on the display panel. The lighting fixture is intelligent, flexile and strong in adaptability.

10 Claims, 2 Drawing Sheets

(51) Int. Cl.
*G02F 1/00* (2006.01)
*G09G 1/00* (2006.01)

(56) References Cited

U.S. PATENT DOCUMENTS

| | | | | |
|---|---|---|---|---|
| 8,912,016 | B2* | 12/2014 | Godo | G01R 31/2625 |
| | | | | 257/E21.529 |
| 2004/0263202 | A1* | 12/2004 | Iwata | G01N 21/88 |
| | | | | 324/750.22 |
| 2008/0001619 | A1* | 1/2008 | Igarashi | H01J 9/42 |
| | | | | 324/756.01 |
| 2010/0052713 | A1* | 3/2010 | Kunimori | G09G 3/006 |
| | | | | 324/754.01 |
| 2013/0265072 | A1* | 10/2013 | Kim | G09G 3/006 |
| | | | | 324/754.01 |
| 2014/0145739 | A1* | 5/2014 | Park | G09G 3/20 |
| | | | | 324/750.3 |

FOREIGN PATENT DOCUMENTS

| | | |
|---|---|---|
| CN | 101887180 A | 11/2010 |
| CN | 103487958 A | 1/2014 |

\* cited by examiner

LIGHTING FIXTURE

FIELD OF THE INVENTION

The present invention relates to the field of display equipment detection technology, and in particular, to a lighting fixture.

BACKGROUND OF THE INVENTION

After a display panel is produced, a lighting test usually needs to be carried out on the display panel by using a lighting fixture, namely, a signal is loaded on a test point on the display panel by the lighting fixture to detect the display quality of the display panel.

When using an existing lighting fixture to carry out the lighting test on the display panel, at first, the display panel is placed on a worktable of the lighting fixture; and then, a probe on an upper cover of the lighting fixture contacts the test point on the display panel via a mechanical arm or manpower, so as to complete the lighting test.

The inventor of the present invention finds that the existing lighting fixture at least has the following technical problems: since each lighting fixture needs to test a plurality of display panels, and in each test, the same action needs to be repeated by the manpower or the mechanical arm to contact the probe on the upper cover of the lighting fixture with the test point on the display panel, so that the work intensity of a worker is increased; and in addition, since the pressures of the manpower or the mechanical arm on the upper cover are different, and at the contact moment of the probe on the upper cover of the lighting fixture and the test point on the display panel, a huge contact force will be generated therebetween, thus the probe on the upper cover is likely to be bent and even broken for a long time, and meanwhile, the display panel may also be damaged. Therefore, this is a technical problem to be solved urgently.

SUMMARY OF THE INVENTION

In view of the above problems of the existing lighting fixture, the inventor has conducted intensive studies to accomplish the present invention. The object of the present invention is to provide a lighting fixture, which can effectively reduce the bend and even breakage of a probe on an upper cover, and is convenient and safe to detect, so as to prolong the service life of the probe and relieve the work intensity of a worker at the same time.

The technical solution adopted for solving the technical problem of the present invention is a lighting fixture, including: a work load platform, a lifting unit and a lighting test unit;
 the work load platform is used for loading a display panel to be subjected to lighting test;
 the lifting unit is connected with the lighting test unit and is used for driving the lighting test unit to ascend and descend; and
 the lighting test unit is provided with a plurality of probes and is driven by the lifting unit to contact the probes with a circuit test point on the display panel, in order to carry out the lighting test on the display panel.

Preferably, the lifting unit includes a moving cylinder and a transmission rod;
 a piston of the moving cylinder is connected with the transmission rod, and the transmission rod is connected with the lighting test unit;
 the moving cylinder is used for driving the transmission rod to move back and forth along an axial direction thereof; and
 the transmission rod is driven by the moving cylinder to contact the probes of the lighting test unit with the circuit test point on the display panel, in order to carry out the lighting test on the display panel.

Further preferably, the moving cylinder includes a gas supply module, a control module, a solenoid valve and a cylinder barrel;
 the gas supply module is connected with the solenoid valve; the solenoid valve is connected with the control module and the cylinder barrel;
 the control module is used for controlling the opening and closing of an intake valve and an exhaust valve of the solenoid valve;
 the gas supply module is used for transmitting a gas to the cylinder barrel when the intake valve of the solenoid valve is open; and
 the cylinder barrel is used for propelling the transmission rod to move through the piston therein when the gas enters the cylinder barrel, and resetting the piston when the gas is exhausted from the interior of the cylinder barrel.

Further preferably, the gas supply module includes a gas source, a switch control assembly and a gas regulator;
 wherein, the gas source is connected with the switch control assembly, and the switch control assembly is connected with the gas regulator;
 the gas source is used for storing the gas;
 the switch control assembly is used for controlling whether to exhaust the gas in the gas source or not; and
 the gas regulator is used for regulating the pressure of the gas exhausted by the gas source.

Further preferably, each of the solenoid valve and the cylinder barrel includes a gas inlet and a gas outlet, the gas inlet of the solenoid valve is connected with the gas inlet of the cylinder barrel, and the gas outlet of the solenoid valve is connected with the gas outlet of the cylinder barrel.

Further preferably, the control module is further used for controlling the opening degrees of the intake valve and the exhaust valve of the solenoid valve to regulate the gas flow entering the cylinder barrel.

Preferably, the lighting fixture further includes a power supply control module, and the power supply control module is connected with the lifting unit and used for controlling the lifting unit to work or not.

The present invention has the following advantageous effects:
 the lighting fixture according to the present invention controls the lighting test unit to ascend and descend by a lifting unit by use of the electrical principle; compared with the existing lighting fixture which works by means of manpower or a mechanical arm, the lighting fixture according to the present invention can effectively reduce the bend and even breakage of the probes on the upper cover and can carry out detection conveniently, so that the service lives of the probes can be prolonged, and meanwhile, the work intensity of the worker is relieved. Specifically, when the lighting test is carried out on the display panel, the lighting test unit is driven by the lifting unit to descend to contact the probes on the lighting test unit with the circuit test point on the display panel, in order to carry out the lighting test on the display panel; and after the detection, the lighting test unit is driven by the lifting unit to ascend to separate the probes on the lighting test unit from the circuit test point on the display panel. The lighting fixture is simple to operate and is easy to implement.

REFERENCE SIGNS 1. work load platform; 2. lifting unit; 21. transmission rod; 3. lighting test unit; 4. power supply control module.

DESCRIPTION OF THE PREFERRED EMBODIMENT

In order to make those skilled in the art better understand the technical solutions of the present invention, the present invention will be further described in detail below in combination with the accompanying drawings and specific embodiments.

Figure 1:
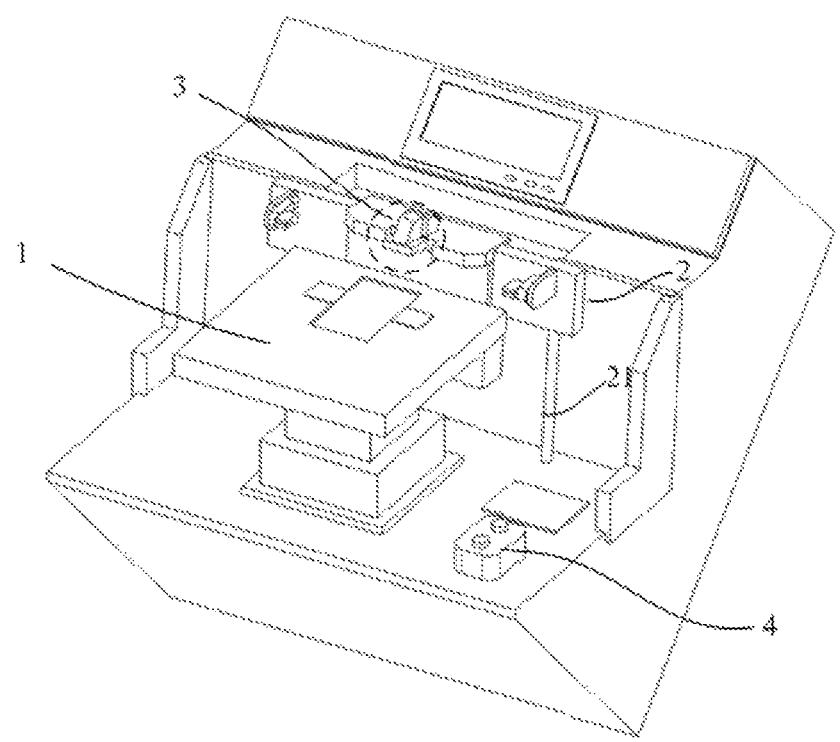
FIG. 1 is a configuration schematic diagram of a lighting fixture of an embodiment of the present invention.
Figure 2:
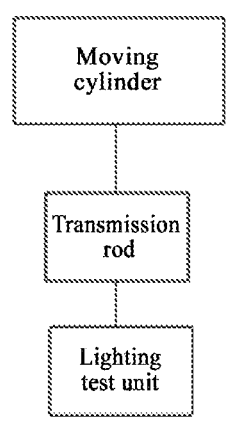
FIG. 2 is a schematic diagram of the lighting fixture of the embodiment of the present invention in which the lifting unit is a cylinder.
Figure 3:
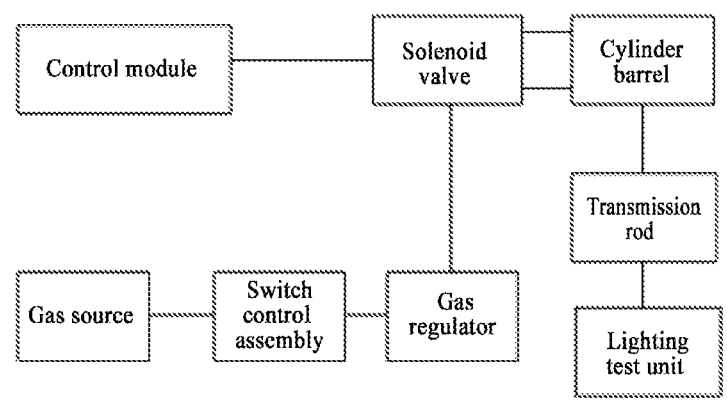
FIG. 3 is a specific schematic diagram of the lighting fixture of the embodiment of the present invention in which the lifting unit is a cylinder.

As shown in FIG. 1 to FIG. 3, an embodiment provides a lighting fixture, including a work load platform 1, a lifting unit 2 and a lighting test unit 3. The work load platform 1 is used for loading a display panel to be subjected to lighting test; the lifting unit 2 is connected with the lighting test unit 3 and used for driving the lighting test unit 3 to ascend and descend; and the lighting test unit 3 is provided with a plurality of probes and driven by the lifting unit 2 to contact the probes with a circuit test point on the display panel, in order to carry out the lighting test on the display panel.

The lighting fixture provided by the embodiment controls the lighting test unit 3 to ascend and descend through one lifting unit 2 by use of the electrical principle, and due to the control of the electrical principle rather than manual control, the work intensity of a worker is relieved. Specifically, when the lighting test is carried out on the display panel, the lighting test unit 3 is driven by the lifting unit 2 to descend until the probes on the lighting test unit 3 contact with the circuit test point on the display panel, in order to carry out the lighting test on the display panel; and after the detection, the lighting test unit 3 is driven by the lifting unit 2 to ascend to separate the probes on the lighting test unit 3 from the circuit test point on the display panel.

By adopting the lighting fixture of the present invention, in the entire process of lighting test on the display panel, the detection is completely carried out in an electrical mode, an operator does not need to press the probes on the lighting test unit 3 to contact the circuit test point on the display panel (namely, no manpower or mechanical arm is needed), thus avoiding the phenomenon that when different operators or the same operator carries out the lighting test on different display panels, the probes are bent and even broken due to different pressing forces to cause adverse effects on the display panel.

As a preferred mode of the embodiment, as shown in FIG. 2, the aforementioned lifting unit 2 includes a moving cylinder and a transmission rod 21; a piston (not shown in the figure) of the moving cylinder is connected with the transmission rod 21, and the transmission rod 21 is connected with the lighting test unit 3; the moving cylinder is used for driving the transmission rod 21 to move back and forth along an axial direction thereof; and the transmission rod 21 is driven by the moving cylinder to contact the probes of the lighting test unit 3 with the circuit test point on the display panel, in order to carry out the lighting test on the display panel.

Wherein, as shown in FIG. 3, the moving cylinder includes a gas supply module, a control module, a solenoid valve and a cylinder barrel. The gas supply module is connected with the solenoid valve; the solenoid valve is connected with the control module and the cylinder barrel; the control module is used for controlling the opening and closing of an intake valve and an exhaust valve of the solenoid valve; the gas supply module is used for transmitting a gas to the cylinder barrel when the intake valve of the solenoid valve is open; and the cylinder barrel is used for propelling the transmission rod 21 to move through the piston therein when the gas enters the cylinder barrel, and resetting the piston when the gas is exhausted from the interior of the cylinder barrel. It should be noted that, the gas supply module, the solenoid valve and the cylinder barrel are communicated.

Specifically, when the gas supply module is needed to supply the gas, the control module controls the intake valve of the solenoid valve to open, at this time, the gas enters the cylinder barrel through the solenoid valve, the piston in the cylinder barrel is propelled by the pressure of the gas to move, since the piston is connected with the transmission rod 21, the transmission rod 21 can be propelled to move, the movement of the transmission rod 21 drives the probes on the lighting test unit 3 to move until the probes contact the circuit test point on the display panel, therefore, the lighting test on the display panel is realized.

After the lighting test, the gas supply module stops supplying the gas, the control module controls the intake valve of the solenoid valve to close and the exhaust valve to open, at this time, the gas in the cylinder barrel is exhausted with the opening of the exhaust valve, thereafter the piston is reset, and meanwhile, the probes of the lighting test unit 3 depart from the circuit test point on the display panel.

Wherein, the gas supply module includes a gas source, a switch control assembly and a gas regulator. The gas source is connected with the switch control assembly, and the switch control assembly is connected with the gas regulator; the gas source is used for storing the gas; the switch control assembly is used for controlling whether to exhaust the gas in the gas source or not; and the gas regulator is used for regulating the pressure of the gas exhausted by the gas source.

Particularly, to regulate the pressure of the gas exhausted by the gas source, the gas supply module in the embodiment is provided with the gas regulator, so that the pressure of the gas exhausted by the gas source meets the pressure for propelling the piston in the cylinder barrel.

In the present invention, the pressure of the gas exhausted by the gas source is regulated and is controlled to a specific value, thus when the lighting test is repeated, the contact force during each contact of the probes on the lighting test unit and the circuit test point on the display panel is appropriate and consistent. Therefore, bend and even breakage of the probes are further avoided, the service lives of the probes are prolonged, and the abrasion of the display panel is reduced.

Wherein, each of the solenoid valve and the cylinder barrel is provided with a gas inlet and a gas outlet, the gas inlet of the solenoid valve is connected with the gas inlet of the cylinder barrel, and the gas outlet of the solenoid valve is connected with the gas outlet of the cylinder barrel.

In the embodiment, since the gas inlet of the solenoid valve is connected with the gas inlet of the cylinder barrel, and the gas outlet of the solenoid valve is connected with the gas outlet of the cylinder barrel, an intake process and an exhaust process do not interfere with each other.

In the embodiment, the control module is further used for controlling the opening degrees of the intake valve and the exhaust valve of the solenoid valve to regulate the gas flow entering the cylinder barrel, so as to control the speed of propelling the transmission rod 21. For example, in the intake process, when the opening degree of the intake valve is relatively large, the gas flow entering the cylinder barrel is relatively large, and then the moving speed of the transmission rod 21 is faster, on the contrary, when the opening degree of the intake valve is relatively smaller, the gas flow entering the cylinder barrel is relatively small, and then the moving speed of the transmission rod 21 is slower. In this way, the moving speed of the transmission rod 21 can be controlled to enable the probes on the lighting test unit to slowly contact the circuit test point on the display panel, so as to avoid generating impact on the probes on the lighting test unit and the circuit test point on the display panel due to the overlarge moving speed of the transmission rod 21, resulting in bend and even breakage of the probes, or an adverse phenomenon on the display panel.

As shown in FIG. 1, the lighting fixture of the embodiment further includes a power supply control module 4, and the power supply control module 4 is connected with the lifting unit 2 and used for controlling the lifting unit 2 to work or not.

The lighting fixture provided by the embodiment adopts the electrical principle to flexibly control the lifting unit 2, particularly, a cylinder is used as a main component of the lifting unit 2, and the lighting fixture is simple and convenient to operate and easy to implement.

It can be understood that, the above embodiments are merely exemplary embodiments used for illustrating the principle of the present invention, but the present invention is not limited thereto. Those of ordinary skill in the art can make a variety of modifications and improvements without departing from the spirit and essence of the present invention, and these modifications and improvements shall fall into the protection scope of the present invention.

The invention claimed is:

1. A lighting fixture, comprising: a work load platform, a lifting unit and a lighting test unit; wherein
the work load platform is used for loading a display panel to be subjected to lighting test;
the lifting unit is connected with the lighting test unit and used for driving the lighting test unit to ascend and descend; and
the lighting test unit is provided with a plurality of probes and is driven by the lifting unit to contact the plurality of probes with a circuit test point on the display panel, in order to carry out the lighting test on the display panel, wherein
the lifting unit further comprises a moving cylinder and a transmission rod;
a piston of the moving cylinder is connected with the transmission rod, and the transmission rod is connected with the lighting test unit;
the moving cylinder is used for driving the transmission rod to move back and forth along an axial direction thereof; and
the transmission rod is driven by the moving cylinder to contact the plurality of probes of the lighting test unit with the circuit test point on the display panel, in order to carry out the lighting test on the display panel.

2. The lighting fixture of claim 1, wherein the moving cylinder comprises a gas supply module, a control module, a solenoid valve and a cylinder barrel;
the gas supply module is connected with the solenoid valve; the solenoid valve is connected with the control module and the cylinder barrel;
the control module is used for controlling the opening and closing of an intake valve and an exhaust valve of the solenoid valve;
the gas supply module is used for transmitting a gas to the cylinder barrel when the intake valve of the solenoid valve is open; and
the cylinder barrel is used for propelling the transmission rod to move through the piston therein when the gas enters the cylinder barrel, and resetting the piston when the gas is exhausted from an interior of the cylinder barrel.

3. The lighting fixture of claim 2, wherein the gas supply module comprises a gas source, a switch control assembly and a gas regulator;
the gas source is connected with the switch control assembly, and the switch control assembly is connected with the gas regulator;
the gas source is used for storing the gas;
the switch control assembly is used for controlling whether to exhaust the gas in the gas source or not; and
the gas regulator is used for regulating the pressure of the gas exhausted by the gas source.

4. The lighting fixture of claim 2, wherein each of the solenoid valve and the cylinder barrel is provided with a gas inlet and a gas outlet, the gas inlet of the solenoid valve is connected with the gas inlet of the cylinder barrel, and the gas outlet of the solenoid valve is connected with the gas outlet of the cylinder barrel.

5. The lighting fixture of claim 2, wherein the control module is further used for controlling opening degrees of the intake valve and the exhaust valve of the solenoid valve to regulate gas flow entering the cylinder barrel.

6. The lighting fixture of claim 1, further comprising a power supply control module, wherein the power supply control module is connected with the lifting unit and is used for controlling the lifting unit to work or not.

7. The lighting fixture of claim 2, further comprising a power supply control module, wherein the power supply control module is connected with the lifting unit and is used for controlling the lifting unit to work or not.

8. The lighting fixture of claim 3, further comprising a power supply control module, wherein the power supply control module is connected with the lifting unit and is used for controlling the lifting unit to work or not.

9. The lighting fixture of claim 4, further comprising a power supply control module, wherein the power supply control module is connected with the lifting unit and is used for controlling the lifting unit to work or not.

10. The lighting fixture of claim 5, further comprising a power supply control module, wherein the power supply control module is connected with the lifting unit and is used for controlling the lifting unit to work or not.

* * * * *